United States Patent
Bozin et al.

(10) Patent No.: US 8,676,551 B1
(45) Date of Patent: Mar. 18, 2014

(54) MULTI-SOLVER SIMULATION OF DYNAMIC SYSTEMS IN A MODELING ENVIRONMENT

(75) Inventors: Aleksandar Bozin, Cambridge (GB); Robert O. Aberg, South Grafton, MA (US)

(73) Assignee: The MathWorks, Inc., Natick, MA (US)

( * ) Notice: Subject to any disclaimer, the term of this patent is extended or adjusted under 35 U.S.C. 154(b) by 524 days.

(21) Appl. No.: 12/723,246

(22) Filed: Mar. 12, 2010

(51) Int. Cl.
  *G06G 7/48* (2006.01)
(52) U.S. Cl.
  USPC ............................................. 703/6
(58) Field of Classification Search
  USPC .............................. 703/6; 716/116
  See application file for complete search history.

(56) References Cited

U.S. PATENT DOCUMENTS

| | | | |
|---|---|---|---|
| 2005/0216248 A1* | 9/2005 | Ciolfi et al. | 703/22 |
| 2006/0064292 A1* | 3/2006 | Clune | 703/17 |
| 2006/0241921 A1* | 10/2006 | Willis | 703/2 |

OTHER PUBLICATIONS

Kalro et al., A parallel 3D computational method for fluid-structure interactions in parachute systems, 2000, Elsevier, pp. 321-332.*
Zhang et al., An Effective Interaction Control Mechanism with Minor Step for Multidisciplinary Collarborative Simulation System, 2010, IEEE, pp. 542-547.*
Shome, Siddhartha S. et al., "Dual-Rate Integration Using Partitioned Runge-Kutta Methods for Mechanical Systems with Interacting Systems," Mechanics Based Design of Structures and Machines, vol. 32(3):253-282 (2004).

* cited by examiner

*Primary Examiner* — Omar Fernandez Rivas
*Assistant Examiner* — Bernard E Cothran
(74) *Attorney, Agent, or Firm* — Nelson Mullins Riley & Scarborough LLP

(57) ABSTRACT

Two or more solvers used in a simulation of a dynamic system may exchange information during minor steps of at least one of the solvers. The information may be exchanged one way—that is, a first solver sending the information to a second solver after the second solver's minor step, or it may be exchanged two ways (or multiple ways in a case with more than two solvers). If the solvers are instances of the same type of solver, they may exchange information at each minor step.

33 Claims, 11 Drawing Sheets

Input: A system of ODE (3), initial condition $x(t_0)$, $k = 0$ and $i = 1$. An explicit $s$-stage RK solver $\mathfrak{S}$.
Output: Solution $x(t_k^i)$, $i = 1, 2, \ldots, s$, $k = 0, 1, \ldots$.

1: loop
2:     $f_i \leftarrow f\left(x(t_k^i), t_k^i\right)$
3:     $x\left(t_k^{i+1}\right) \leftarrow x(t_k) + h_k \sum_{j=1}^{i} a_{ij} f_j$
4:     if $i = s$ then
5:        $x(t_{k+1}) \leftarrow x\left(t_k^{s+1}\right)$
6:        $i \leftarrow 1$
7:        $k \leftarrow k + 1$
8:     else
9:        $i \leftarrow i + 1$
10:     end if
11: end loop

*Fig. 6*

Input: A partitioned system of ODE (15)–(16), initial condition $x(t_0)$, $k_p = 0$ and $i_p = 1$, $p = 1, \ldots, m$. An explicit $s_p$-stage RK solver $\mathfrak{S}_p$, $p = 1, \ldots, m$. Initialized solver queue $\mathcal{Q}$.

Output: Solutions $x_p^c\left(t_{k_p}^{i_p}\right)$ and $x_p^d(t_{k_p})$, $i_p = 1, 2, \ldots, s_p$, $k_p = 0, 1, \ldots$.

1: loop
2:     for $p \in \mathcal{Q}$ do     ▷ Ready to run
3:         $y_p^c\left(t_{k_p}^{i_p}\right) \leftarrow h_p^c\left(x_p^c\left(t_{k_p}^{i_p}\right), x_p^d(t_{k_p}), u_p^c\left(t_{k_p}^{i_p}\right), u_p^d(t_{k_p}), t_{k_p}\right)$
4:         if $i_p = 1$ then     ▷ Only during first stage
5:             $y_p^d(t_{k_p}) \leftarrow h_p^d\left(x_p^c(t_{k_p}), x_p^d(t_{k_p}), u_p^c(t_{k_p}), u_p^d(t_{k_p}), t_{k_p}\right)$
6:         end if
7:     end for
8:     for $p \in \mathcal{Q}$ do
9:         if $i_p = 1$ then
10:            $x_p^d(t_{k_p+1}) \leftarrow f_p^d\left(x_p^c(t_{k_p}), x_p^d(t_{k_p}), u_p^c(t_{k_p}), u_p^d(t_{k_p}), t_{k_p}\right)$
11:         end if
12:         $f_{p_{i_p}}^c \leftarrow f_p^c\left(x_p^c\left(t_{k_p}^{i_p}\right), x_p^d(t_{k_p}), u_p^c\left(t_{k_p}^{i_p}\right), u_p^d(t_{k_p}), t_{k_p}^{i_p}\right)$
13:         $x_p^c\left(t_{k_p}^{i_p+1}\right) \leftarrow x_p^c(t_{k_p}) + h_{k_p}^p \sum_{j=1}^{i_p} a_{i_p,j}^p f_{p_j}^c$
14:         if $i_p = s_p$ then
15:             $x_p^c(t_{k_p+1}) \leftarrow x_p^c\left(t_{k_p}^{s_k+1}\right)$
16:             $i_p \leftarrow 1$
17:             $k_p \leftarrow k_p + 1$
18:         else
19:             $i_p \leftarrow i_p + 1$
20:         end if
21:     end for
22: end loop

*Fig. 8*

Input: A partitioned system of ODE (15)–(16), initial condition $x(t_0)$, $k = 0$ and $i = 1$. An explicit $s$-stage RK solver $\mathfrak{S}$. Initialized solver queue $\mathcal{Q}$.

Output: Solutions $x_p^c(t_k^i)$ and $x_p^d(t_k)$, $i = 1, 2, \ldots, s$, $k = 0, 1, \ldots$.

1: loop
2:    parfor $p \in \mathcal{Q}$ do     ▷ Execute in parallel
3:       $y_p^c(t_k^i) \leftarrow h_p^c\left(x_p^c(t_k^i), x_p^d(t_k), u_p^c(t_k^i), u_p^d(t_k), t_k\right)$
4:       if $i_p = 1$ then     ▷ Only during first stage
5:          $y_p^d(t_k) \leftarrow h_p^d\left(x_p^c(t_k), x_p^d(t_k), u_p^c(t_k), u_p^d(t_k), t_k\right)$
6:       end if
7:    end for
8:    parfor $p \in \mathcal{Q}$ do     ▷ Execute in parallel
9:       if $i = 1$ then
10:          $x_p^d(t_{k+1}) \leftarrow f_p^d\left(x_p^c(t_k), x_p^d(t_k), u_p^c(t_k), u_p^d(t_k), t_k\right)$
11:       end if
12:       $f_{p_i}^c \leftarrow f_p^c\left(x_p^c(t_k^i), x_p^d(t_k), u_p^c(t_k^i), u_p^d(t_k), t_k^i\right)$
13:       $x_p^c(t_k^{i+1}) \leftarrow x_p^c(t_k) + h_k \sum_{j=1}^i a_{ij} f_{p_j}^c$
14:    end for
15:    if $i = s$ then
16:       $x_p^c(t_{k+1}) \leftarrow x_p^c(t_k^{s+1})$
17:       $i \leftarrow 1$
18:       $k \leftarrow k + 1$
19:    else
20:       $i \leftarrow i + 1$
21:    end if
22: end loop

*Fig. 9*

MULTI-SOLVER SIMULATION OF DYNAMIC SYSTEMS IN A MODELING ENVIRONMENT

BACKGROUND

Graphical analysis, simulation, and execution tools may be used in modeling, design, analysis, and synthesis of engineered systems. These tools provide a visual representation of a model, such as a block diagram. The visual representation provides a convenient interpretation of model components and structure.

Block diagrams are used to model real-world systems. Historically, engineers and scientists have utilized time-based block diagram models in numerous scientific areas, such as, for example, Feedback Control Theory and Signal Processing, to study, design, debug, and refine dynamic systems. Dynamic systems, which are characterized by the fact that their behaviors change over time, are representative of many real-world systems.

A dynamic system is a system whose response at any given time is a function of its input stimuli, its current state, and the current time. Such systems range from simple to highly complex systems. Physical dynamic systems include a falling body, the rotation of the earth, bio-mechanical systems (muscles, joints, etc.), bio-chemical systems (gene expression, protein pathways), etc. Examples of man-made or engineered dynamic systems include: a bouncing ball, a spring with a mass tied on an end, automobiles, airplanes, control systems in major appliances, communication networks, audio signal processing, nuclear reactors, and a stock market.

A block diagram model of a dynamic system is represented schematically as a collection of blocks interconnected by lines that represent signals. A signal represents the input and output of a dynamic system. Each block represents an elemental dynamic system. A line emanating at one block and terminating at another signifies that the output of the first block is an input to the second block. Each distinct input or output on a block is referred to as a port. Signals correspond to the time-varying quantities represented by each line connection and are assumed to have values at each time instant at which the connecting blocks are enabled. The source block of a signal writes to the signal at a given time instant when its system equations are solved. The destination blocks of this signal read from the signal when their system equations are solved.

Time-based block diagram models may be thought of as relationships between signals and state variables representative of a dynamic system. The solution—computation of system response—of the model is obtained by evaluating these relationships over time. The time-based relationship may start at a user-specified "start time" and end at a user-specified "stop time", or the evaluations may continue indefinitely. Each evaluation of these relationships is part of a time step. Signals represent quantities that change over time, and these quantities are defined for all points in time between the block diagram's start and optional stop time. The relationships between signals and state variables are defined by sets of equations represented by blocks. These equations define a relationship between the input signals, output signals, state, and time.

The term "block diagram" as used herein is also used to refer to other graphical modeling formalisms. For instance, flow-charts are block diagrams of entities that are connected by relations. Flow-charts are used to capture process flow and are not generally suitable for describing dynamic system behavior. Data flow block diagrams are diagrams of entities with relations between them that describe a graphical programming paradigm where the availability of data is used to initiate the execution of blocks, where a block represents an operation and a line represents execution dependency describing the direction of data flowing between blocks. It will be appreciated that a block diagram model may include entities that are based on other modeling domains within the block diagram. A common characteristic among these various forms of block diagrams is that they define semantics on how to execute them.

As noted above, professionals from diverse areas such as engineering, science, education, and economics build computational models of dynamic systems in order to better understand system behavior as it changes with the progression of time. The computational models aid in building "better" systems, where "better" may be defined in terms of a variety of performance measures such as quality, time-to-market, cost, speed, size, power consumption, robustness, etc. The computational models also aid in analyzing, debugging and repairing existing systems, be it the human body or the anti-lock braking smystem in a car. The models may also serve an educational purpose of educating others on the basic principles governing physical systems. The models and results are often used as a scientific communication medium between humans. The term "model-based design" is used to refer to the use of block diagram models in the development, analysis, and validation of dynamic systems.

As systems become more complex, an increasingly large amount of time and effort is involved in creating accurate, detailed models. These models are typically hybrid dynamic systems that span a variety of domains, including continuous dynamics and discrete behavior, physical connections, and event-driven states. To add to the complexity, these systems may be depicted in a number of ways, including dynamic or physics block diagrams, finite state machines, and hand-written or automatically generated computer code.

Multiple solvers may be employed to simulate a model. These solvers may be instances of the same solver and/or multiple different solvers working in parallel. The subsystems on which the solvers operate may have continuous and/or discrete states. Major and minor time steps are used during simulation of models with continuous states by solvers. The minor time step is a subdivision of the major time step and is used as part of the solver algorithm.

BRIEF DESCRIPTION OF THE FIGURES

FIG. 6 is a pseudocode representation of a processing method according to an embodiment;

FIG. 8 is a pseudocode representation of a processing method of scheduling solvers in a partitioned hybrid system;

FIG. 9 is a pseudocode representation of a processing method of scheduling solvers to execute in parallel in a partitioned hybrid system;

DETAILED DESCRIPTION

Figure 1:
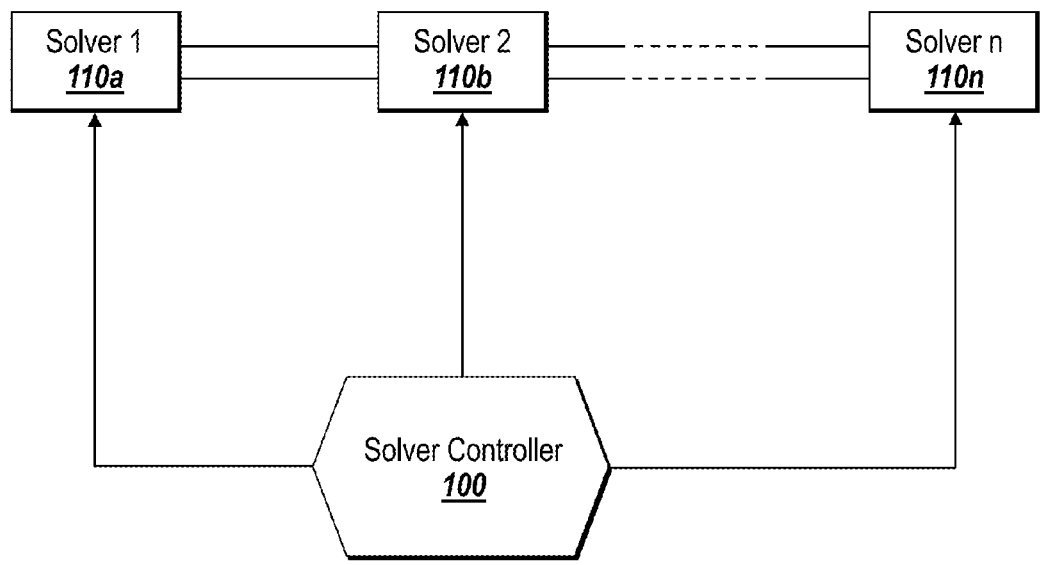
FIG. 1 is an illustration of a system including a controller and solvers according to an embodiment.

For ease of explanation, references and examples herein discussing the design and simulation environment are made to block diagrams being processed in a MATLAB™ modeling environment and Simulink™ modeling environment from the MathWorks, Inc. Natick, Mass. It should be understood however, that the present invention is equally applicable to a variety of modeling environments, including graphical and/or textual modeling environments, data-flow modeling, and three dimensional modeling environments.

Dynamic systems are typically modeled graphically. Graphical models may also be represented as sets of differential, difference, and/or algebraic equations. At any given instant of time, these equations may be viewed as relationships between the system's output response ("outputs"), the system's input stimuli ("inputs") at that time, the current state of the system, the system parameters, and time. The state of the system may be thought of as a numerical representation of the dynamically changing condition of the system. For instance, in a physical system modeling a simple pendulum, the state may be viewed as the current position and velocity of the pendulum. Similarly, a signal-processing system that filters a signal would maintain a set of previous inputs and intermediate internal values as the state. The system parameters are the constant coefficients in the system's equations. For the pendulum example, a parameter is the length of pendulum; and for the filter example, a parameter is one of the values of the filter taps and/or is an array of values.

A system may include two or more partitions, or may be comprised of two or more subsystems. The subsystems/partitions may be systems of different domains, such as, for example, mechanical, electrical, etc. There may be a solver that may be appropriate for more than one domain and/or subsystems, but in many cases it may be that some solvers are more appropriate for some particular domains. A combination of solvers may be used to simulate a complex system. The combination may include different solvers and/or same kind of solvers applied to different partitions. The solvers may run independently and, due to the fact that most solutions can be numerical approximations, if they are not able to communicate in between steps, their solutions may diverge from each other. Therefore, to maintain a coherent simulation of the system as a whole, the solvers may need to exchange information with each other and adjust their approximations based on the information received from other solvers. Traditionally, such information is exchanged after major steps. That is, after a solver completes one or more major steps, it may send information to another solver or receive information from another solver and use it to interpolate and/or extrapolate a better approximation for its own partition. Interpolation may include calculating an intermediary value based on two or more values, whereas extrapolation may include calculating a value based on two or more previous values.

In an embodiment, two or more solvers exchange information during minor steps of at least one of the solvers. The information may be exchanged one way—that is, a first solver sending the information to a second solver after the second solver's minor step, or it may be exchanged two ways (or multiple ways in a case with more than two solvers). If the solvers are instances of the same type of solver, the information may be exchanged in a synchronized manner, such that each solver has taken the same number of minor steps in the intervals between the exchange of the information. Despite the synchronized execution, the solvers may run independently of each other and may execute, for example, on different cores and/or different processors or machines, resulting in possible lack of synchronization even if they have the same step sizes because of different clock times. The clock time differences may arise because of real world clock differences and/or because of differences in simulations. If the solvers are different, the size of their steps may differ, and their execution need not be synchronized both in simulation time and clock time.

It may be convenient to control the execution of the solvers such that, if the information exchanged does not include values needed for future calculations, the needed values are interpolated, rather than extrapolated from the available information. The interpolation may be performed by the solver sending the information, or a solver receiving the information, and/or yet another mechanism, as determined by one of skill in the art. In an embodiment, if a first solver is providing information to a second solver, the first solver's interpolant may be used to obtain needed interpolated values. In another embodiment, the second solver's own interpolant may be used instead. An interpolant is a function for calculating a needed unknown value based on known values. In an embodiment, a simulation controller may schedule and control the execution of different solvers in order to assure effective exchange of information between them. Illustrated in FIG. 1 is a system including a controller and solvers according to an embodiment. As shown, multiple solvers 110a-n may be employed in simulating a model. Each solver may solve equations needed to simulate its own partition and/or subsystem of the model. The solvers 110a-n may be independent from each other in that they may be executed concurrently, whether on the same hardware or not. For example, the solvers 110a-n may be executed in a distributed environment, such that two or more solvers are executed on different cores ad/or different processors or machines. The solvers 110a-n may be controlled by a simulation controller 100. The simulation controller 100 may schedule the order of execution of major and/or minor steps of different solvers and may control the exchange of information between the solvers. Both solvers 110a-n and/or the controller 100 may be implemented in software and/or hardware, as deemed appropriate by one of skill in the art. The controller 100 may be a combination of multiple controllers controlling the execution of different schedulers. In an alternative embodiment, the controller 100 may be formed by controllers within each of the schedulers working cooperatively to resolve the order of execution of the solvers as necessary during the model simulation.

A set of solvers 110a-n may include two or more instances of the same type of solver. Alternatively, or in addition to the same type of solvers, it may include different type of solvers. The solvers may include different continuous solvers and/or discrete solvers. Continuous solvers solve differential equations, while discrete solvers solve difference equations. In implementations with both continuous and discrete solvers, the available solvers may exchange information such that at least one continuous solver sends and/or receives information during the continuous solver's minor steps.

Figure 2A:
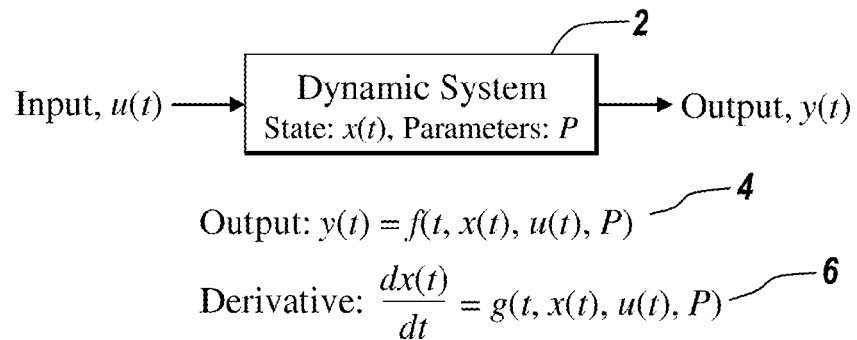
FIGS. 2A-C are examples of different modeling constructs that may be used to represent dynamic systems.

In order to provide a basis for description of embodiments, a discussion of different types of mathematical models used in representing and simulating dynamic models is presented below in relation to FIGS. 2A-C.

Types of Models Used to Represent Dynamic Systems

There are four common types of mathematical models that are typically used in simulating the dynamic systems. The first type of mathematical models describes systems using ordinary differential equations (ODEs) and is depicted in FIG. 2A. The dynamic system 2 specifies a set of two equations: Output 4 and Derivative 6. The Output equation 4 facilitates the computation of the system's output response at a given time instant as a function of its inputs, states, parameters, and time. The Derivative equation 6 is an ordinary differential equation that allows the computation of the derivative of the states at the current time as a function of the inputs, the states, parameters, and time. This class of models may be suitable for systems in which it is useful to track the system response as a continuous function of time. Such continuous-time systems are commonly representative of physical systems (mechanical, thermal, electrical). For some systems, it may be possible to use the Output 4 and Derivative equations 6 to obtain a closed-form solution for the output response y(t). But in many complex real world systems, the response of the system may be obtained by integrating the states through numerical means.

The definition of an ODE used herein encompasses both implicit and explicit differential equations. The class of ordinary differential equations may require additional equations to define the system being modeled. For example, equations called projections may be required to impose constraints on the differential variables (e.g., states $X_1$ and $X_2$ may fall on the manifold defined by $X_1^2+X_2^2=25$). These constraints can be either applied as a secondary condition or a coupled condition to the differential equation. Although systems including the projections may conventionally no longer qualify as an ODE; they are included here to simplify the categories of systems. Another example is the use of a Jacobian equation that defines partial derivatives with respect to the independent and/or differential variables. The Jacobian equation is typically used when obtaining a linear approximation of a non-linear model or an overall linear model of a set of equations. Jacobian equations may be used for some forms of numerical integration, for producing a linear model once the model has reached its steady state operating point, etc. The Output 4 and Derivatives equations 6 may be extended to define other relationships for an element and/or subsystem of a model. For example, the Output equation 4 may help manage its states by defining a relationship where it resets a state back to a known quantity at a specific point in time or when a specific condition is seen.

Figure 2B:
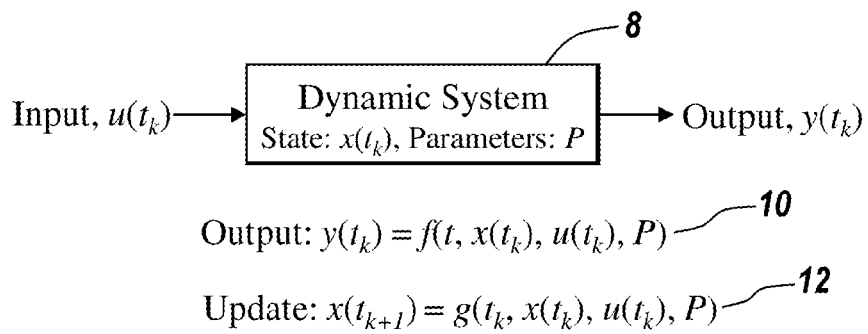

Another type of mathematical model describes systems using difference equations as depicted in FIG. 2B. The dynamic system 8 specifies a set of two equations: Output 10 and Update 12. The Output equation 10 facilitates the computation of the system's output response at a given time instant as a function of the inputs, states at some previous time, parameters, and time. The Update equation 12 is a difference equation that allows the computation of the states at the current time as a function of the inputs, states at some previous time, parameters, and time. This class of models is suitable for systems in which it is useful to track the system response at discrete points in time. Such discrete-time systems are commonly representative of discrete-time control and digital signal processing systems. For some systems, it may be possible to use the Output 10 and Update equations 12 to obtain a closed-form solution for the output response y(t). But in many complex real world systems, the response of a system is solved through recursion. The Output 10 and Update equations 12 are applied repeatedly to solve for the system response over a period of time.

Figure 2C:
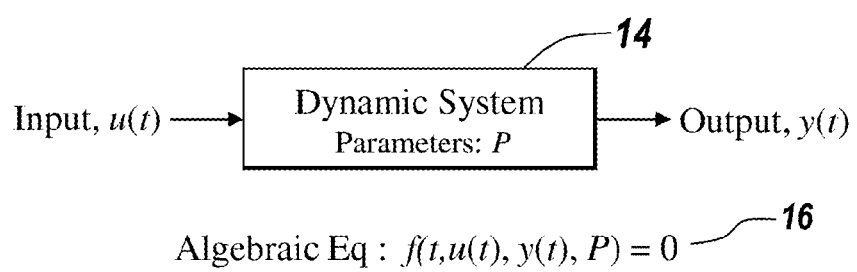

An additional type of mathematical model describes systems using algebraic equations as depicted in FIG. 2C. The dynamic system 14 uses an algebraic equation 16 that needs to be solved at each time to obtain the outputs. While some systems may allow one to obtain a closed-form solution for the system inputs and outputs, practical algebraic equations may best be solved iteratively using a numerical method involving both perturbations and iterations.

A fourth type of mathematical model is a composite system that has components that fall into some or all of the three types of models discussed above. Many complex real-world system models fall into this category. This class of systems has Output, Derivative, Update, and potentially other equations. Solving for the output response of such systems may involve a combination of the solution approaches discussed for all of the classes above. One example of a composite system is one described by differential-algebraic equations (DAEs), which contain both differential equations and algebraic equations. Grouped within the composite class of systems are many extensions involving relationships (equations) defined in terms of both outputs and state. For example, it may be possible to define a limited integration relationship for a differential variable. This relationship may involve a set of equations that consists of the Output equation, an Update equation, a Derivative equation, and a Zero Crossing equation. The Zero Crossing equation defines the points in time where the upper and lower limits of the limited integration occur. Another example of an extension is a notion of Enable and Disable equations that define relationships among states or signals when parts of a system are activated and deactivated during execution.

Inherent in the four classes of systems (ODE, difference equations, algebraic equations and composite) is an idea of system sample time. The sample-time is a time interval at which the inputs, state, or outputs (collectively referred to as the results) of the system are traced as time progresses. Based on sample times, a system can be described as a discrete-time system, continuous-time system and/or hybrid system.

A discrete-time system is a system in which the evolution of the system results and states are tracked at finite intervals of time. In the limit as the interval approaches zero, the discrete-time system becomes a continuous-time system. The intervals of time may be periodic or non-periodic. Sometimes, non-periodic rate systems are referred to as non-uniform rate systems meaning that there is no periodic rate at which the response can be tracked. Non-uniform-rate systems can fall into the class of composite systems where an additional equation may be used to define when in the future the other equations associated with the system should be evaluated.

A continuous-time system is a system in which the evolutions of the system results and states are notionally continuously changing. Continuous-time signals change during numerical integration (minor time steps). An example of a continuous-time system is one described by an ODE. There can also be algebraic or composite continuous-time systems. A hybrid system is a system with both discrete-time and continuous-time elements. A continuous-time system and/or a hybrid system may be solved using one or more solvers employing techniques such as Runge-Kutta, Adams, and others.

If a system has only one sample time, it is said to be single-rate. If a system has multiple sample times, including asynchronous times, or is event-based, it is said to be multi-rate. Multi-rate systems can be evaluated (executed) using either a single-tasking form of execution or a multi-tasking form of execution. Systems may also be categorized by the type of numerical integration solver being used. A fixed-step system is one that uses a fixed-step solver. Fixed-step solvers typically use explicit methods to compute the next continuous state at fixed periodic intervals of time. A variable-step system is one that is using a variable-step solver. A variable-step solver can use either implicit or explicit methods to compute the next continuous state at non-periodic intervals of time.

Generally, variable-step solvers use a form of error control to adjust the interval size such that the desired error tolerances are achieved.

In practice, except for the most basic systems, mathematical models for dynamic systems involve a complex set of mathematical transformations applied in some prescribed manner with the outputs of some transformations forming the inputs of others. Each elemental transformation may be viewed in isolation as a simple dynamic system falling into one of the categories listed above. Therefore, a complex dynamic system may be modeled as an interconnection of various simple dynamic systems. A schematic representation of such an interconnection that has evolved over the years is a graphical model referred to herein as a "block diagram."

Figure 3:
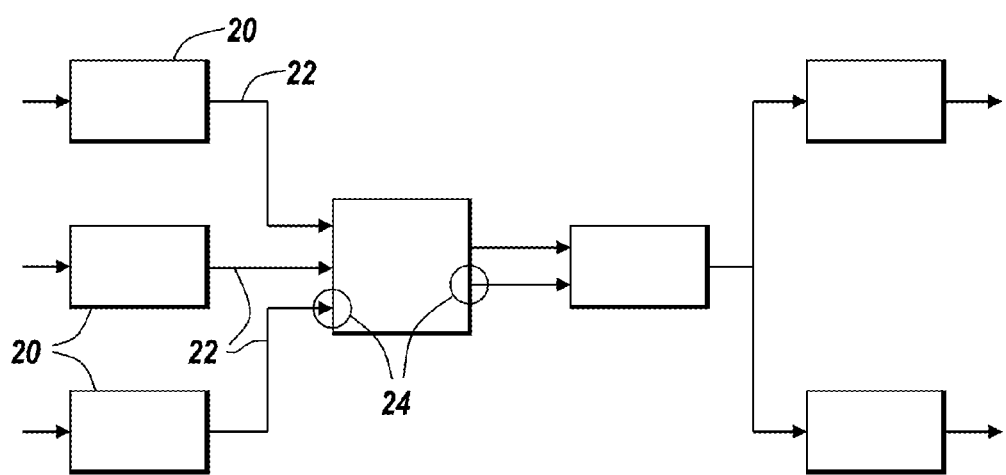
FIG. 3 is a schematic illustration of a block diagram model of a dynamic system.

A block diagram model of a dynamic system is represented schematically as a collection of blocks interconnected by lines that represent signals. A signal represents the input and output of a dynamic system. Each block represents an elemental dynamic system. A line emanating at one block and terminating at another signifies that the output of the first block is an input to the second block. Each distinct input or output on a block is referred to as a port. Signals correspond to the time-varying quantities represented by each line connection and are assumed to have values at each time instant. The source block of a signal writes to the signal at a given time instant when its system equations are solved. The destination blocks of this signal read from the signal when their system equations are being solved. The basic components of a block diagram are illustrated in FIG. 3. The block diagram includes a plurality of blocks 20, lines 22 and ports 24 that are interconnected. Those skilled in the art will recognize that the term "blocks" does not refer exclusively to elemental dynamic systems but may also include other modeling elements that aid in readability and modularity of block diagrams.

Block diagram models are time-based relationships between signals and state variables representative of a dynamic system. The solution (computation of system response) of the model is obtained by evaluating these relationships over time, where time starts at a user-specified "start time" and ends at a user-specified "stop time". Each evaluation of these relationships is referred to as a time step. Signals represent quantities that change over time, and these quantities are defined for all points in time between the block diagram's start and stop time. The relationships between signals and state variables are defined by sets of equations represented by blocks. These equations define a relationship between the input signals, output signals, state, and time. Inherent in the definition is the notion of parameters, which are the coefficients of the equations.

Block diagram modeling may be performed on a variety of software products such, for example, as Simulink® modeling environment from he Mathworks, Inc. of Natick, Mass. Such products allow users to perform various types of tasks including constructing system models through a user-interface that allows drafting block diagram models, allowing augmentation of a pre-defined set of blocks with custom user-specified blocks, the use of the block diagram model to compute and trace the temporal evolution of the dynamic system's outputs ("executing" or "simulating" the block diagram), and automatically producing either deployable software systems or descriptions of hardware systems that mimic the behavior of either the entire model or portions of it (referred to herein as "code generation").

Block operations may be implemented in the model as methods or functions, and may receive any number of parameters as arguments. More formally, mathematical representations of the exemplary block operations, in a time-based block diagram modeling environment, such as Simulink® modeling environment, may be set forth as follows:

input signal: u(t)
state: x(t)
output signal: y(t)
Outputs: y(t)=f(t,x(t),u(t))
Update: $x_d(t)$=g(t,x(t),u(t))
Derivatives: $\dot{x}_c(t)$=h(t,x(t),u(t))
where x(t)=[$x_d(t);x_c(t)$]

A block may be executed when it has a sample hit. Execution of a block may involve executing the block operations by solving the equations defined by the operations. An output operation is executed to generate an output of the block which updates the block's output signals, y(t), while an update operation is executed to update a state of the block.

A block diagram model may be simulated in a simulation loop that may execute the operations associated with the blocks in the block diagram model, e.g. the output, update and derivative operations discussed above. The simulation loop may be performed in a single iteration or in multiple iterations. The number of calls to the output and derivative operations during integration in the simulation loop may be dependent on the type of solver being used.

Multi-Solver Simulation Using Minor Steps Updates

In a multi-solver simulation, with components exchanging information through the continuous time signals, it may be necessary to make approximations in order to advance each of the solvers. Typically, dynamic iteration is performed at the end of each major step.

In an embodiment, in a multi-solver simulation, solvers may be allowed to communicate their minor time step updates and/or derivatives to other solvers in a controlled and/or specified fashion. The multi-solver simulation may involve components using multiple instances of potentially different ODE and/or DAE solvers running at potentially different time steps. Communicating information during minor steps, without waiting for a completion of a major step may provide better approximations and, thus, may improve the convergence rate of the iterative solving process.

Figure 4:
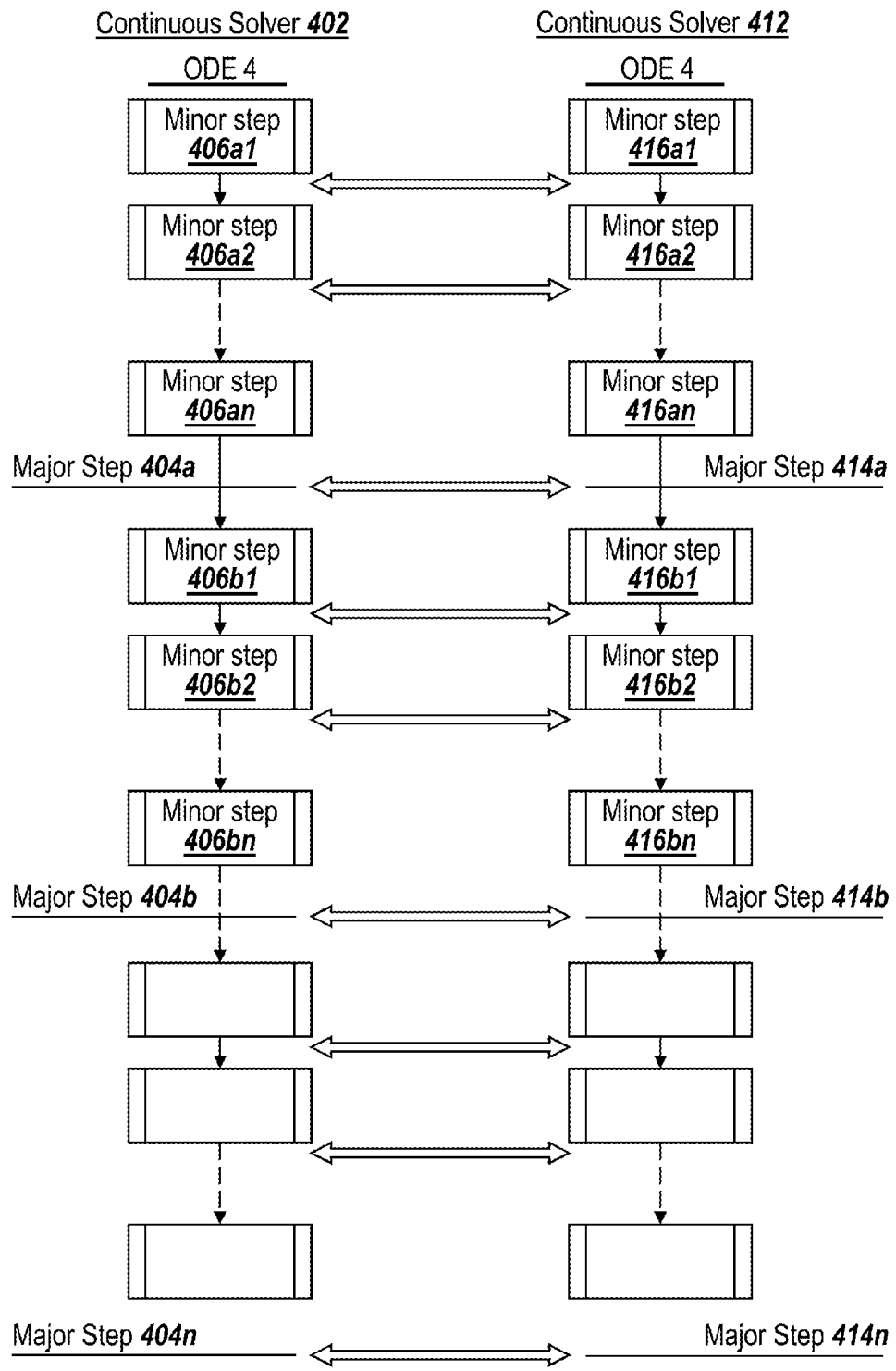
FIG. 4 is an illustration of solvers exchanging information at minor step.

FIG. 4 is an illustration of solvers exchanging information at minor steps. Solvers 402 and 412 are continuous solvers of the same type. Thus their time steps may be of the same size and they may exchange information at each minor step. Major steps of each solver (404a through 404n for solver 402 and 414a through 414n for solver 412) each may include multiple minor steps (406a1-n, 406b1-n, 416a1-n, 416b1-n, etc.). Where in the prior art, updates and derivatives are communicated only at the end of major steps, such as 404a-n and 414a-n, in an embodiment, updates and derivatives may be exchanged at the completion of minor steps, as shown by double-sided arrows. In such a case where solvers' minor steps sizes are the same, no interpolation or extrapolation may be necessary and each of the solvers may directly use the received values. Solvers 402 and 412 may be executed such that they take their minor sequentially or concurrently, whichever is determined best for a particular application. Concurrent execution may take place on the same or different cores/processors/machines.

Figure 5A:
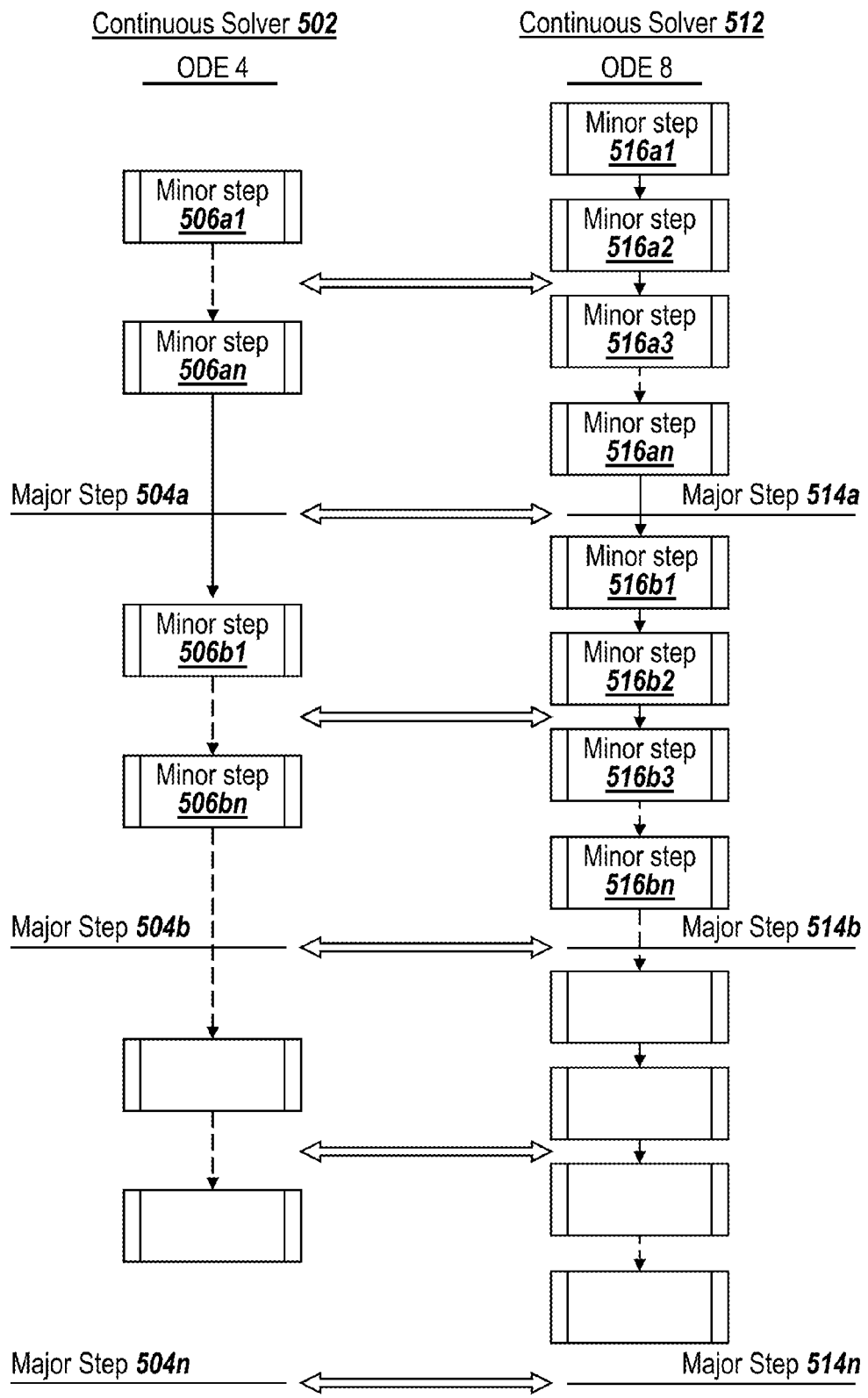
FIGS. 5A-B illustrate solvers exchanging information at minor steps where number of minor steps or step sizes of the solvers are not the same.

FIG. 5A is an illustration of different solvers exchanging information at minor steps. Shown are $4^{th}$-order continuous solver 502 and $8^{th}$ order continuous solver 512. Solvers 502 and 512 have different number of minor steps between each major step. The size of each major step may be the same or different between these solvers, depending on the step size. As illustrated, for every one minor step 506a1-n or 506b1-n of solver 502, solver 512 takes two minor steps 516a1, 516a2, 516a3, 516a4-n, or 516b1, 516b2, 516b3, 516b4-n. Even though additional information is not available for each minor step of solver 512, the exchange of information after every second minor step, as shown, may be beneficial to getting more accurate results combined with more efficient computation or less computation.

Figure 5B:
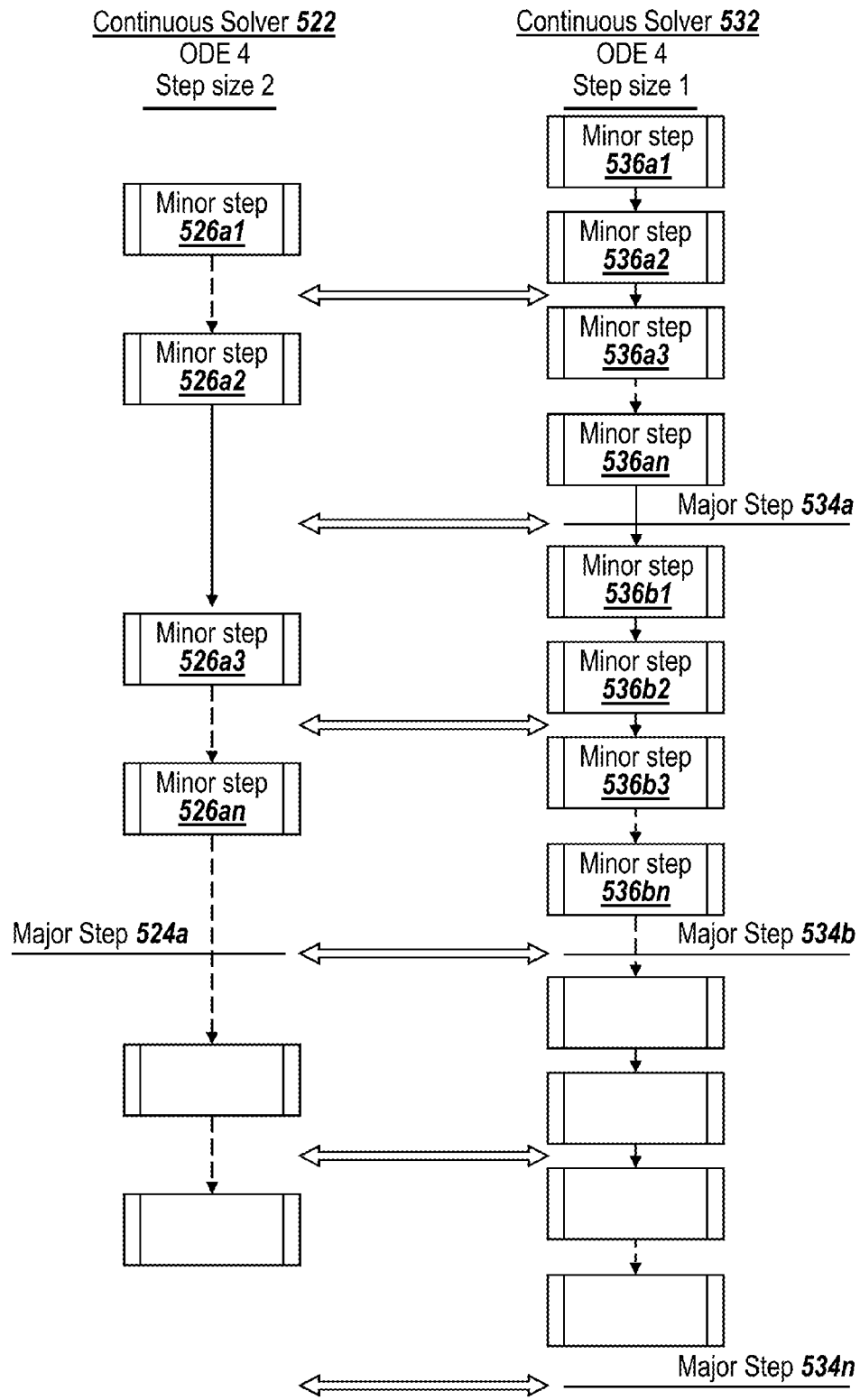

FIG. 5B is an illustration of solvers executing concurrently and exchanging information at minor steps where step sizes of the solvers is not the same. Solvers 522 and 532 are both 4$^{th}$ order ODE solvers, but they have different step sizes, such that multiple minor steps 536a1, 536a2, 536a3-n of solver 532 may be equal to one or a fraction of one minor step 526a1-2 of solver 522 or multiple minor steps 536b1, 536b2, 536b3-n of solver 532 may be equal to one or a fraction of one minor step 526a3-n of solver 522. Despite different step sizes, the exchange of information after conclusion of some minor steps may still be useful in speeding up convergence and reducing errors. For example, information can be exchanged after conclusion of a minor step of a solver with a longer minor step size (solver 522 in this case). If the steps of the solvers do not line up, it may be necessary to interpolate or extrapolate needed values. In an embodiment, execution of the solvers is arranged such that any values not directly available are interpolated rather than extrapolated in order to provide better approximations.

In cases where step sizes of the solvers and/or number of minor steps between major steps is relatively prime between two or more solvers, information may be exchanged after the least common multiple number of steps. For example, if the step size of one solver is 2 and the step size of another solver is 3, information may be exchanged after every 6 minor steps. Interpolated values may be used at those steps where information is not exchanged.

Exchanging information from minor steps may involve modifying solvers and/or implementing a controller to schedule execution of the solvers and exchange of information. Solver modifications, including applicable calculations, are discussed below and in connection with FIGS. 6 and 7. Controlling and scheduling solver execution is described below in connection with FIGS. 8 and 9.

Updating the ODE Solvers to Exchange Information at Minor Steps

In the discussion of ODE solvers below, the following notation is used:

𝕊 Multi-stage ODE solver

S Dynamic system

S$^c$ Continuous-time dynamic system

S$^d$ Discrete-time dynamic system x State vector u Input vector y Output vector ℝ Real numbers ℕ Set of positive integer numbers {0, 1, 2, . . . } t Time (t∈ℝ)

In an embodiment, a class of multi-stage ODE solvers using Runge-Kutta methods exchange information from the minor step updates in order to reduce the integration error. The Runge-Kutta methods (RK) are a family of iterative methods for approximation of ODE solutions. A RK method may be written in a form of Butcher's tableau $$\begin{array}{c|ccccc} 0 & & & & & \\ c_2 & a_{21} & & & & \\ c_3 & a_{31} & a_{32} & & & \\ \vdots & \vdots & \vdots & \ddots & & \\ c_s & a_{s1} & a_{s2} & \cdots & a_{s,s-1} & \\ \hline & b_1 & b_2 & \cdots & b_{s-1} & b_s \end{array} \quad (1)$$

where coefficients $c_i$ satisfy the following condition:

$$c_i = \sum_{j=1}^{i-1} a_{ij} \quad (2)$$

For a system of ODE $$\dot{x}(t) = f(x(t), t) \quad (3)$$

the explicit RK formula may be expressed as $$x(t_{k+1}) = x(t_k) + h_k \sum_{i=1}^{s} b_i f_i \quad (4)$$

where $$f_1 = f(x(t_k), t_k) \quad (5)$$

and $$f_i = f(x(t_k) + h_k \Sigma_{j=1}^{i-1} a_{ij} f_j, t_k + c_i h_k) \quad (6)$$

for i=2, 3, . . . , s. In order to exchange information from the minor steps $t_k + c_i h_k$, the s-stage method my be treated as a series of 1-stage methods. That is, at each step I the derivatives may be calculated as:

$$f_i = f(x(t_k^i), t_k^i) \quad (7)$$

where $$x(t_k^i) = x(t_k) + h_k \sum_{j=1}^{i-1} a_{ij} f_j \quad (8)$$

and $$t_k^i = t_k + c_i h_k \quad (9)$$

Then the state may be updated as:

$$x(t_k^{i+1}) = x(t_k) + h_k \sum_{j=1}^{i} a_{ij} f_j \quad (10)$$

In order to update the state, only the current state vector and its previous i values are needed. This way of updating the state is illustrated in an implementation of the s-stage method as a series of s 1-stage methods shown in FIG. 6. This type of processing may be applied to any number of continuous solvers operating on subsystems and/or system partitions.

Continuous-Time and Discrete-Time Hybrid Systems

In an embodiment, information may be exchanged at minor steps of at least one continuous solver in a system including both continuous and discrete solvers. Such a hybrid system (S) may include:

1. A continuous-time system ($S^c$), and
2. A discrete-time system ($S^d$)

System $S^c$ may be described by a set of ordinary differential equations:

$$t \in [t_k, t_{k+1})$$

$$\dot{x}^c(t) = f^c(x^c(t), x^d(t_k), u^c(t), u^d(t_k), t)$$

$$y^c(t) = h^c(x^c(t), x^d(t_k), u^c(t), u^d(t_k), t) \tag{11}$$

Discrete-time system $S^d$ may be represented with difference equations:

$$x^d(t_{k+1}) = f^d(x^c(t_k), x^d(t_k), u^c(t_k), u^d(t_k), t_k)$$

$$y^d(t_k) = h^d(x^c(t_k), x^d(t_k), u^c(t_k), u^d(t_k), t_k) \tag{12}$$

If the system (11)-(12) is a multi-domain one, including a number of coupled sub-systems $S_p$, p=1, . . . m, S may be partitioned into m components and each one may be solved with the appropriate solver, instead of solving the whole system S with a single solver. In order to achieve that, in an embodiment, the continuous and discrete-time state vectors may be partitioned into m components $$x^c(t) = [x_1^c(t), x_2^c(t), \ldots, x_{i-1}^c(t), x_i^c(t), x_{i+1}^c(t), \ldots, x_{m-1}^c(t), x_m^c(t)]^T$$

$$x^d(t_k) = [x_1^d(t_k), x_2^d(t_k), \ldots, x_{i-1}^d(t_k), x_i^d(t_k), x_{i-1}^d(t_k), \ldots, x_{m-1}^d(t_k), x_m^d(t_k)]^T \tag{13}$$

The reduced state vectors may be described as follows:

$$\bar{x}_p^c(t) = [x_1^c(t), x_2^c(t), \ldots, x_{p-1}^c(t), x_{p+1}^c(t), \ldots, x_{m-1}^c(t), x_m^c(t)]^T$$

$$\bar{x}_p^d(t_k) = [x_1^d(t_k), x_2^d(t_k), \ldots, x_{p-1}^d(t_k), x_{p+1}^d(t_k), \ldots, x_{m-1}^d(t_k), x_m^d(t_k)]^T \tag{14}$$

$\bar{x}_p^c(t)$ and $\bar{x}_p^d(t_k)$ are obtained from $x^c(t)$ and $x^d(t_k)$ by removing corresponding components $x_p^c(t)$ and $x_p^d(t_k)$, respectively.

Using (13)-(14), representations (1)-(12) may be rewritten as a system ($S_p^c$, p=1, . . . , m) of ordinary differential equations:

$$\dot{x}_p^c(t) = f_p^c(x_p^c(t), \bar{x}_p^d(t_k), u_p^c(t), u_p^d(t_k), t)$$

$$y_p^c(t) = h_p^c(x_p^c(t), \bar{x}_p^d(t_k), u_p^c(t), u_p^d(t_k), t) \tag{15}$$

and a system of difference equations ($S_p^d$, p=1, . . . , m)

$$x_p^d(t_{k+1}) = f_p^d(x_p^c(t_k), \bar{x}_p^d(t_k), u_p^c(t_k), u_p^d(t_k), t_k)$$

$$y_p^d(t_k) = h_p^d(x_p^c(t_k), \bar{x}_p^d(t_k), u_p^c(t_k), u_p^d(t_k), t_k) \tag{16}$$

External subsystem inputs are defined as $$u_p^c(t) = g_p^c(\bar{x}_p^c(t), \bar{x}_p^d(t_k), u^c(t), u^d(t_k), t) = l_p^c(\bar{y}_p^c(t), \bar{y}_p^d(t_k), u^c(t), u^d(t_k), t) \tag{17}$$

and $$u_p^d(t_k) = g_p^d(\bar{x}_p^c(t_k), \bar{x}_p^d(t_k), u^c(t_k), u^d(t_k), t) = l_p^d(\bar{y}_p^c(t_k), \bar{y}_p^d(t_k), u^c(t_k), u^d(t_k), t) \tag{18}$$

where $$\bar{y}_p^c(t) = [y_1^c(t), y_2^c(t), \ldots, y_{p-1}^c(t), y_{p+1}^c(t), \ldots, y_{m-1}^c(t), y_m^c(t)]^T$$

$$\bar{y}_p^d(t_k) = [y_1^d(t_k), y_2^d(t_k), \ldots, y_{p-1}^d(t_k), y_{p+1}^d(t_k), \ldots, y_{m-1}^d(t_k), y_m^d(t_k)]^T \tag{19}$$

Figure 7:
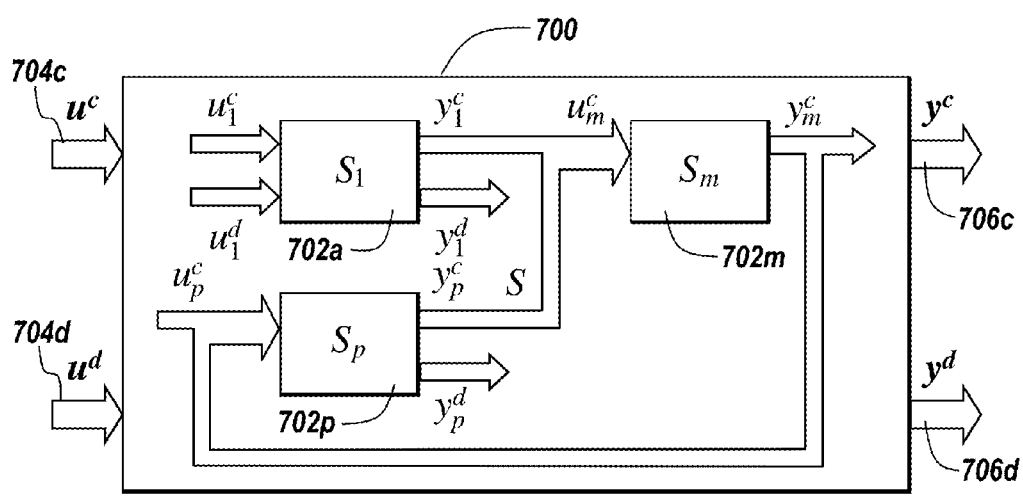
FIG. 7 is a schematic representation of a partitioned hybrid dynamic system.

A resulting partitioned system S is shown in FIG. 7. System 700 accepts inputs 704c-d and produces outputs 706c-d. System 700 includes subsystems 702a, 702p and 702m. If the actual subsystem inputs $u_p^c(t)$ and $u_p^d(t_k)$, p=1, . . . , m cannot be calculated exactly, they may be replaced with estimates, which may be obtained by interpolation as follows:

$$\hat{u}_p^c(t) = g_p^c(\bar{x}_p^c(t), \bar{x}_p^d(t_k), u^c(t), u^d(t_k), t) = l_p^c(\bar{y}_p^c(t), \bar{y}_p^d(t_k), u^c(t), u^d(t_k), t) \tag{20}$$

and $$\hat{u}_p^d(t_k) = g_p^c(\bar{x}_p^c(t_k), \bar{x}_p^d(t_k), u^c(t_k), u^d(t_k), t) = l_p^c(\bar{y}_p^c(t_k), \bar{y}_p^d(t_k), u^c(t_k), u^d(t_k), t) \tag{21}$$

Expressions (2) and (21) may be calculated using known interpolation algorithms, in some cases even without any approximation. In an embodiment, interpolation techniques may be selected based on the type of signal being integrated by the solver for which interpolation is needed. For example, in an embodiment, if the signal is smooth and integrable, then spline, linear, and other interpolation techniques may be used. In an embodiment, zero order hold may be used as an interpolant. Other intepolants, such as, for example, zero and/or first order hold, may be employed, as deemed appropriate by one of skill in the art. Interpolation may be performed on the solver for which interpolation is needed or by the solver providing the information. Interpolation may be performed based on values and/or derivatives and other information provided by the solvers.

From (15) and (20), it is possible to get the following decoupled system ($\hat{S}_p^c$, p=1, . . . , m) of ordinary differential equations:

$$\dot{x}_p^c(t) = f_p^c(x_p^c(t), x_p^d(t_k), \hat{u}_p^c(t), \hat{u}_p^d(t_k), t)$$

$$y_p^c(t) = h_p^c(x_p^c(t), x_p^d(t_k), \hat{u}_p^c(t), \hat{u}_p^d(t_k), t) \tag{22}$$

Similarly, from (16) and (21), it is possible to get the following decoupled system of difference equations ($\hat{S}_p^d$, p=1, . . . , m):

$$x_p^d(t_{k+1}) = f_p^d(x_p^c(t_k), x_p^d(t_k), \hat{u}_p^c(t_k), \hat{u}_p^d(t_k), t_k)$$

$$y_p^d(t_k) = h_p^d(x_p^c(t_k), x_p^d(t_k), \hat{u}_p^c(t_k), \hat{u}_p^d(t_k), t_k) \tag{23}$$

An example of a multi-solver processing algorithm that solves (15)-(16) and/or (22)-(23) using m solvers is shown in FIG. 8. This algorithm makes use of the solver queue that at any moment of time contains a list of solvers ready to run. The controller 100 determines the next appropriate solver and instructs that solver to execute a step.

In an embodiment where solvers $\mathsf{S}_p$, p=1, . . . , m are identical, sequential algorithm shown in FIG. 7 may be implemented as a parallel implementation. Moreover, the actual subsystem inputs $u_p^c(t)$ and $u_p^d(t_k)$, given by (17)-(18) may be calculated exactly, and, therefore, the algorithm may achieve the same numerical accuracy as a single solver applied to the whole system. Parallel implementation of the multi-solver processing of FIG. 8 is shown in FIG. 9.

Scheduling of solvers may be determined during execution, as illustrated in FIGS. 7 and 8. In an alternative embodiment, the simulation controller 100 and/or additional scheduler may pre-compute an appropriate solver schedule that may be applied during the simulation. The solvers being scheduled may execute in parallel on different cores of a multi-core machine or on different processors and/or different computing nodes within a networking or other set-up. Known in the art there are multi-step ODE methods that may be executed in parallel, however, what those known methods do is execute a single solver in parallel in multiple threads/cores. In comparison, embodiments presented herein execute multiple solvers running in parallel and exchanging information with each other during minor steps of at least one of the solvers.

Exemplary Architecture

Figure 10:
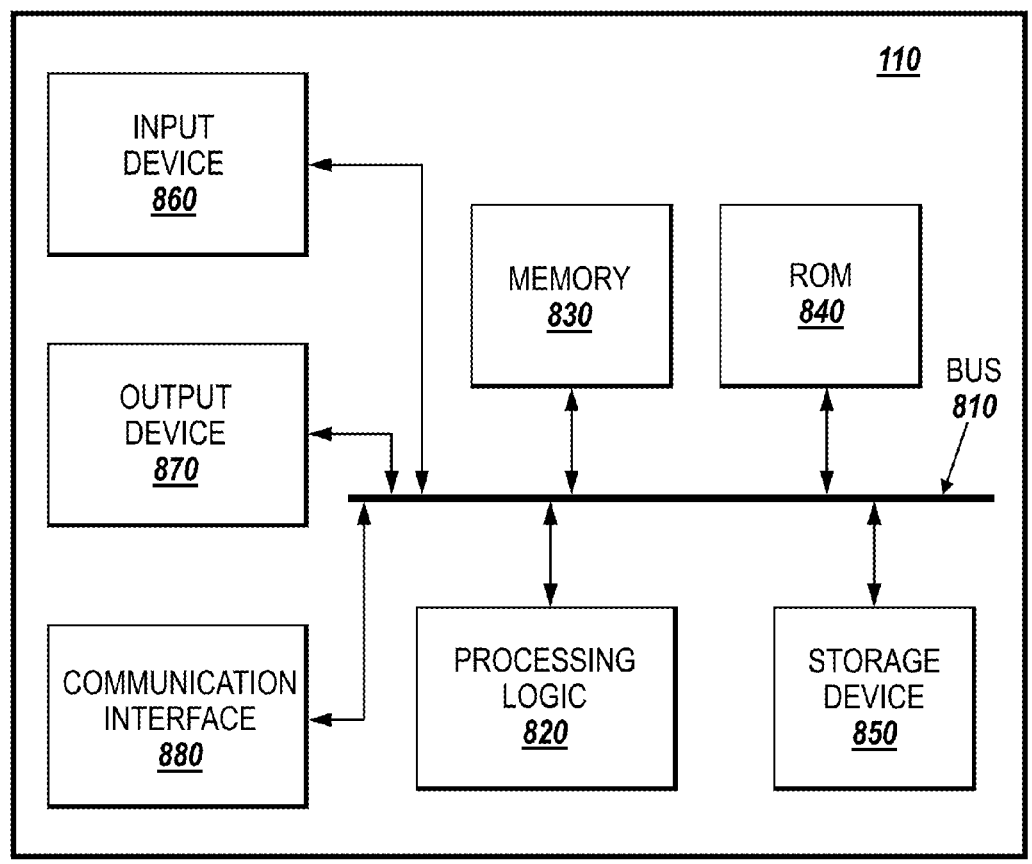
FIG. 10 illustrates an exemplary computer architecture.

FIG. 10 illustrates an exemplary computer architecture that can be used to implement system of FIG. 1 and embodiments described herein. FIG. 10 is an exemplary diagram of an entity corresponding to computer 110 and/or server 130. As illustrated, the entity may include a bus 810, processing logic 820, a main memory 830, a read-only memory (ROM) 840, a storage device 850, an input device 860, an output device 870, and/or a communication interface 880. Bus 810 may include a path that permits communication among the components of the entity.

Processing logic 820 may include a processor, microprocessor, or other types of processing logic that may interpret and execute instructions. In one implementation, processing logic 820 may include a single core processor or a multi-core processor. In another implementation, processing logic 820 may include a single processing device or a group of processing devices, such as a processor cluster or computing grid. In still another implementation, processing logic 820 may include multiple processors that may be local or remote with respect each other, and may use one or more threads while processing.

Main memory 830 may include a random access memory (RAM) or another type of dynamic storage device that may store information and instructions for execution by processing logic 820. ROM 840 may include a ROM device or another type of static storage device that may store static information and/or instructions for use by processing logic 820. Storage device 850 may include a magnetic, solid state and/or optical recording medium and its corresponding drive, or another type of static storage device that may store static information and/or instructions for use by processing logic 820.

Input device 860 may include logic that permits an operator to input information to the entity, such as a keyboard, a mouse, a pen, a touchpad, an accelerometer, a microphone, voice recognition, camera, neural interface, biometric mechanisms, etc. Output device 870 may include a mechanism that outputs information to the operator, including a display, a printer, a speaker, etc. Communication interface 880 may include any transceiver-like logic that enables the entity to communicate with other devices and/or systems. For example, communication interface 880 may include mechanisms for communicating with another device or system via a network.

The entity depicted in FIG. 10 may perform certain operations in response to processing logic 820 executing software instructions contained in a computer-readable medium, such as main memory 830. A computer-readable medium may be defined as a physical or logical memory device. The software instructions may be read into main memory 830 from another computer-readable storage medium, such as storage device 850, or from another device via communication interface 880. The software instructions contained in main memory 830 may cause processing logic 820 to perform processes described herein when the software instructions are executed on processing logic. Alternatively, hardwired circuitry may be used in place of or in combination with software instructions to implement processes described herein. Thus, implementations described herein are not limited to any specific combination of hardware circuitry and software.

Although FIG. 10 shows exemplary components of the entity, in other implementations, the entity may contain fewer, different, or additional components than depicted in FIG. 10. In still other implementations, one or more components of the entity may perform one or more tasks described as being performed by one or more other components of the entity.

What is claimed is:

1. A non-transitory computer-readable medium storing instructions that, when executed on a processor, cause the processor to:
receive a partitioned model of a system, where each partition of the partitioned model specifies a solver solving ordinary or partial differential equations; and
simulate the partitioned model, the simulating comprising:
determining a pattern of execution of two or more solvers, where:
the two or more solvers include a first continuous solver and a second continuous solver,
the first continuous solver includes:
a plurality of first major steps, and
one or more of the plurality of first major steps includes a plurality of first minor steps, and
the second continuous solver includes:
a plurality of second major steps, and
one or more of the plurality of second major steps includes a plurality of second minor steps, one or more of the plurality of second minor steps being different than one or more of the plurality of first minor steps; and
controlling the pattern of execution of the first continuous solver and the second continuous solver such that:
the first continuous solver and the second continuous solver exchange information at the plurality of first minor steps or the plurality of second minor steps without waiting for a completion of corresponding ones of the plurality of first major steps or second major steps.

2. The computer-readable medium of claim 1, wherein the ordinary differential equations comprise differential algebraic equations (DAE).

3. The computer-readable medium of claim 1, wherein at least one of the two or more solvers is a discrete solver.

4. The computer-readable medium of claim 1, wherein at least two partitions of the partitioned model specify instances of the same type of solver, wherein controlling the execution of the first continuous solver and the second continuous solver comprises controlling the execution of the first continuous solver and the second continuous solver to run in parallel.

5. The computer-readable medium of claim 1, wherein the determining and the controlling the pattern of execution of the first continuous solver and the second continuous solver comprises:
determining a next solver among the first continous solver and the second continuous solver to execute based on sizes of next first minor step and second minor step; and
instructing the determined next solver to execute a given first minor step or a given second minor step.

6. The computer-readable medium of claim 1, wherein the controlling the pattern of execution further comprises:
executing a given first minor step using the first continuous solver;
sending information from the first continuous solver to the second continuous solver; and
executing a given second minor step using the second continuous solver with the information received from the first continuous solver.

7. The computer-readable medium of claim 6, wherein the information received by the second continuous solver from the first continuous solver comprises data interpolated by the first continuous solver.

8. The computer-readable medium of claim 7, wherein the data interpolated by the first continuous solver comprises data interpolated using the first continuous solver's own interpolant.

9. The computer-readable medium of claim 7, wherein the data interpolated by the first continuous solver comprises data interpolated using the first continuous solver's output values and derivatives.

10. The computer-readable medium of claim 7, wherein the data interpolated by the first continuous solver comprises data interpolated using an interpolation technique different from that of the first continuous solver's own interpolant.

11. The computer-readable medium of claim 6, wherein the information received by the second continuous solver from the first continuous solver comprises state data interpolated by the first continuous solver, wherein using the information received from the first continuous solver further comprises:
    interpolating data needed by the second continuous solver from the state data received from the first continuous solver.

12. The computer-readable medium of claim 11, wherein the state data interpolated by the first continuous solver comprises one or more values and derivatives.

13. The computer-readable medium of claim 12, wherein the signal is smooth and the interpolation technique comprises one or a combination of: spline and linear.

14. The computer-readable medium of claim 11, wherein the using the information received from the first continuous solver to interpolate data needed for the second continuous solver comprises using an interpolation technique selected based on a type of signal being integrated by the second continuous solver.

15. The computer-readable medium of claim 6, further storing instructions that, when executed on the processor, cause the processor to:
    use the information received from the first continuous solver to interpolate data needed for the second continuous solver.

16. The computer-readable medium of claim 6, wherein the controlling the pattern of execution further comprises:
    sending information from the second continuous solver to the first continuous solver; and
    executing another first minor step using the first continuous solver with the information received from the second continuous solver.

17. The computer-readable medium of claim 1, wherein the controlling the pattern of execution of the first continuous solver and the second continuous solver further comprises:
    exchanging information during one or more of the plurality of first major steps and the plurality of second major steps.

18. The medium of claim 1, wherein:
    the two or more solvers use a variable step size, and
    the two or more solvers are independent.

19. The medium of claim 1, wherein:
    the first continuous solver has a first step size,
    the second continuous solver has a second step size that differs from the first step size, and
    the first continuous solver is independent from the second continuous solver.

20. The medium of claim 1, wherein:
    the two or more solvers are independent, and
    the two or more independent solvers run in parallel.

21. The medium of claim 1, wherein:
    the first continuous solver is independent from the second continuous solver, and
    the first continuous solver determines a step size absent information associated with the second continuous solver.

22. A computer-implemented method comprising:
    holding in memory a partitioned model of a system, where each partition specifies a solver solving ordinary or partial differential equations; and
    simulating, using a processor, the partitioned model, wherein the simulating comprises:
        determining a pattern of execution of two or more solvers, where:
            the two or more solvers include a first continuous solver and a second continuous solver,
            the first continuous solver includes:
                a plurality of first major steps, and
                one or more of the plurality of first major steps includes a plurality of first minor steps,
            the second continuous solver includes:
                a plurality of second major steps, and
                one or more of the plurality of second major steps includes a plurality of second minor steps, one or more of the plurality of second minor steps being different than one or more of the plurality of first minor steps; and
        controlling the pattern of execution of the first continuous solver and the second continuous solver such that:
            the first continuous solver and the second continuous solver exchange information at the plurality of first minor steps or the plurality of second minor steps without waiting for a completion of corresponding plurality of first major steps or second major steps.

23. The computer-implemented method of claim 22, wherein the ordinary differential equations comprise differential algebraic equations (DAE).

24. The computer-implemented method of claim 22, wherein at least one of the two or more solvers is a discrete solver.

25. The computer-implemented method of claim 22, wherein the determining and the controlling the pattern of execution of the first continuous solver and the second continuous solver comprises:
    determining a next solver among the first continuous solver and the second continuous solver to execute based on sizes of next first minor step and the second minor step; and
    instructing the determined next solver to execute a given first minor step or a given second minor step.

26. The computer-implemented method of claim 22, wherein the controlling the pattern of execution further comprises:
    executing a given first minor step using the first continuous solver;
    sending information from the first continuous solver to the second continuous solver; and
    executing a given second minor step using the second continuous solver with the information received from the first continuous solver.

27. The computer-implemented method of claim 26, wherein the information received by the second continuous solver from the first continuous solver comprises data interpolated by the first continuous solver.

28. The computer-implemented method of claim 26, further comprising:

using the information received from the first continuous solver to interpolate data needed for the second continuous solver.

29. The method of claim 22, wherein:
the two or more solvers use a variable step size, and
the two or more solvers are independent.

30. The method of claim 22, wherein:
the first continuous solver has a first step size,
the second continuous solver has a second step size that differs from the first step size, and
the first continuous solver is independent from the second continuous solver.

31. The method of claim 22, wherein:
the two or more solvers are independent, and
the two or more independent solvers run in parallel.

32. The method of claim 22, wherein:
the first continuous solver is independent from the second continuous solver, and
the first continuous solver determines a step size absent information associated with the second continuous solver.

33. A computer-implemented system comprising:
a memory storing partitioned model of a real-world system, where each partition specifies a solver solving ordinary or partial differential equations; and
a processor simulating the partitioned model, wherein the simulating comprises:
determining a pattern of execution of two or more solvers, where:
the two or more solvers include a first continuous solver and a second continuous solver,
the first continuous solver includes:
a plurality of first major steps, and
one or more of the plurality of first major steps includes a plurality of first minor steps,
the second continuous solver includes:
a plurality of second major steps, and
one or more of the plurality of second major steps includes a plurality of second minor steps, one or more of the plurality of second minor steps being different than one or more of the plurality of first minor steps; and
controlling the pattern of execution of the first continuous solver and the second continuous solver such that:
the first continuous solver and the second continuous solver exchange information at the plurality of first minor steps or the plurality of second minor steps without waiting for a completion of corresponding plurality of first major steps or second major steps.

\* \* \* \* \*

UNITED STATES PATENT AND TRADEMARK OFFICE
CERTIFICATE OF CORRECTION

PATENT NO. : 8,676,551 B1
APPLICATION NO. : 12/723246
DATED : March 18, 2014
INVENTOR(S) : Aleksandar Bozin et al.

Page 1 of 1

It is certified that error appears in the above-identified patent and that said Letters Patent is hereby corrected as shown below:

Title page, column 2, line 4, under OTHER PUBLICATIONS delete "Collarborative" and insert --Collaborative-- in lieu thereof.

In the Claims

Column 14, line 54, in Claim 5, delete "continous" and insert --continuous-- in lieu thereof.

Signed and Sealed this
Sixteenth Day of September, 2014

Michelle K. Lee
*Deputy Director of the United States Patent and Trademark Office*